(12) United States Patent
Irifune et al.

(10) Patent No.: US 8,872,261 B2
(45) Date of Patent: Oct. 28, 2014

(54) SEMICONDUCTOR DEVICE AND MANUFACTURING METHOD OF THE SAME

(75) Inventors: Hiroyuki Irifune, Hyogo-ken (JP); Wataru Saito, Kanagawa-ken (JP); Yasuto Sumi, Hyogo-ken (JP); Kiyoshi Kimura, Hyogo-ken (JP); Hiroshi Ohta, Hyogo-ken (JP); Junji Suzuki, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 13/607,255

(22) Filed: Sep. 7, 2012

(65) Prior Publication Data
US 2013/0093003 A1    Apr. 18, 2013

(30) Foreign Application Priority Data
Sep. 21, 2011   (JP) ................ P2011-206175

(51) Int. Cl.
*H01L 29/66*    (2006.01)
*H01L 29/78*    (2006.01)

(52) U.S. Cl.
CPC ................ *H01L 29/7802* (2013.01)
USPC ............ 257/329; 438/268; 257/E29.262

(58) Field of Classification Search
None
See application file for complete search history.

(56) References Cited

U.S. PATENT DOCUMENTS

| | | | |
|---|---|---|---|
| 6,888,195 B2 * | 5/2005 | Saito et al. | 257/328 |
| 7,737,469 B2 | 6/2010 | Saito et al. | |
| 7,759,732 B2 | 7/2010 | Saito et al. | |
| 2005/0017292 A1 * | 1/2005 | Onishi et al. | 257/328 |
| 2010/0230750 A1 | 9/2010 | Saito et al. | |

FOREIGN PATENT DOCUMENTS

JP    2007335844 A    12/2007

\* cited by examiner

*Primary Examiner* — W. Wendy Kuo
*Assistant Examiner* — Shaka White
(74) *Attorney, Agent, or Firm* — Patterson & Sheridan, LLP

(57) ABSTRACT

A semiconductor device includes first, second, and third semiconductor layers each having multiple diffusion layers. The first direction widths of the first diffusion layers are the same. The amount of impurity within the first diffusion layers gradually increases from the bottom end towards the top end of the first semiconductor layer. The first direction widths of the second diffusion layers are the same. The amounts of impurity within the second diffusion layers are the same. The first direction widths of the third diffusion layers are narrower than the first direction widths of the first diffusion layers and the first direction widths of the second diffusion layers at the same level, and gradually become narrower from the bottom end towards the top end of the third semiconductor layer. The amount of impurity within the third diffusion layers are the same.

21 Claims, 9 Drawing Sheets

EMBODIMENT 1

COMPARATIVE EXAMPLE

SEMICONDUCTOR DEVICE AND MANUFACTURING METHOD OF THE SAME

CROSS-REFERENCE TO RELATED APPLICATION

This application is based upon and claims the benefit of priority from Japanese Patent Application No. 2011-206175, filed Sep. 21, 2011; the entire contents of which are incorporated herein by reference.

FIELD

Embodiments described herein relate to a semiconductor device, and a manufacturing method of the same.

BACKGROUND

In MOSFETs etc, a Super Junction (SJ) structure to solve problems related to the tradeoff between the element breakdown voltage and the on-resistance is known. The SJ structure is one where p-type semiconductor layers and n-type semiconductor layers are arranged alternately across the substrate.

The present invention provides techniques for further improving the breakdown voltage of a SJ structure without significantly compromising the on-resistance of a SJ structured device.

DETAILED DESCRIPTION

Figure 1:
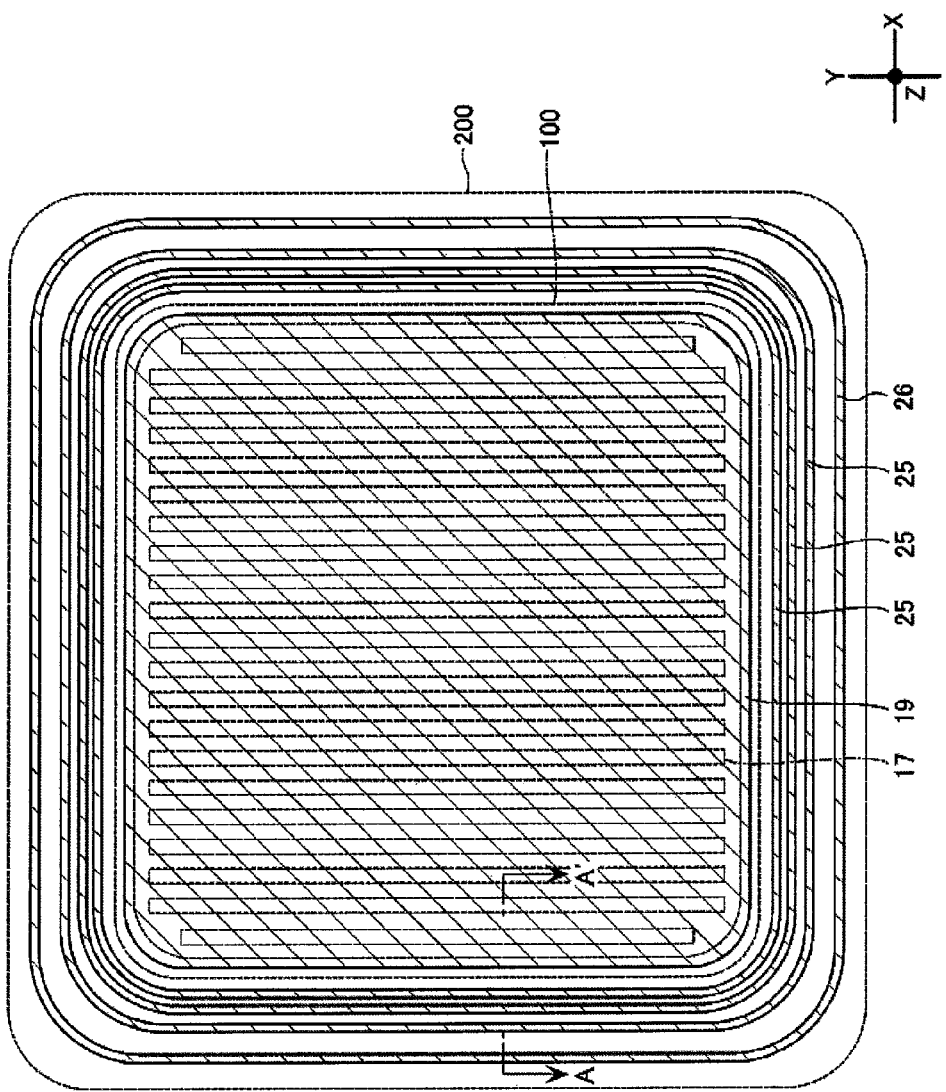
FIG. 1 is a top view diagram of a semiconductor device according to a first embodiment.

In general, the semiconductor devices of the embodiments herein will be explained below, by referencing the diagrams.

According to a first embodiment, there is provided a semiconductor device with an improved breakdown voltage, and its manufacturing method.

The semiconductor device according to one aspect, has a drain electrode, a drain layer of first conductivity type, a periodic structure layer, a third semiconductor layer of first conductivity type, a drift layer of first conductivity type, a base layer of second conductivity type, a source layer of first conductivity type, a gate electrode and, a source electrode. The drain layer is formed over the drain electrode. The periodic structure layer is formed on the surface of the drain layer, and contains pillars that rise or extend in a direction perpendicular to the surface of the drain layer. The periodic structure layer has first semiconductor layers of first conductivity type and second semiconductor layers of second conductivity type arranged alternately in a first direction parallel to an edge of the surface of the drain layer. A third semiconductor layer is also formed on the drain layer, and it adjoins one of the first semiconductor layers which is located at the end of the periodic structure layer. The drift layer is formed over the first semiconductor layer. The base layer is formed over the second semiconductor layer. The source layer is formed over the base layer. The gate electrode is formed over the gate insulation layer on the base layer. The source electrode is connected electrically to the source layer, Each of the first semiconductor layers has multiple first diffusion layers stacked in a vertical direction perpendicular to the surface of the drain layer. Each of the first diffusion layers are of equivalent height as measured in the stacking direction. Each of the second semiconductor layers are immediately neighbored on each of two opposing sides by one of the first semiconductor layers. Also, each of the second semiconductor layers have multiple second diffusion layers stacked in the aforementioned vertical direction, and the diffusion layers have equivalent height as measured in the direction of stacking. The third semiconductor layer has multiple third diffusion layers stacked in the vertical direction. The third diffusion layers are of identical height as measured in the stacking direction. Moreover, the first, second and third diffusion layers are all of uniform height. In each semiconductor layer of a first sub-group of the first semiconductor layers, the width of each of the multiple first diffusion layers is equal to the width of every other diffusion layer in the semiconductor layer. The amount of impurity within the plural first diffusion layers in one first semiconductor layer gradually increases from the bottom end towards the top end of the first semiconductor layer. The first direction widths, of the plural second diffusion layers in one second semiconductor layer, are mutually identical. The amount of impurity within the plural second diffusion layers in one second semiconductor layer are mutually identical or, this changes from the bottom end towards the top end of the second semiconductor layer in a different manner from the change of the amount of impurity within the plural first diffusion layers. The first direction widths of the plural third diffusion layers in one third semiconductor layer are narrower than the first direction widths of the first diffusion layers and the first direction widths of the second diffusion layers present at the same level, and gradually become narrower from the bottom end towards the top end of the third semiconductor layer. The amount of impurity within the plural third diffusion layers in one third semiconductor layer, are mutually identical.

Embodiment 1

Figure 2:
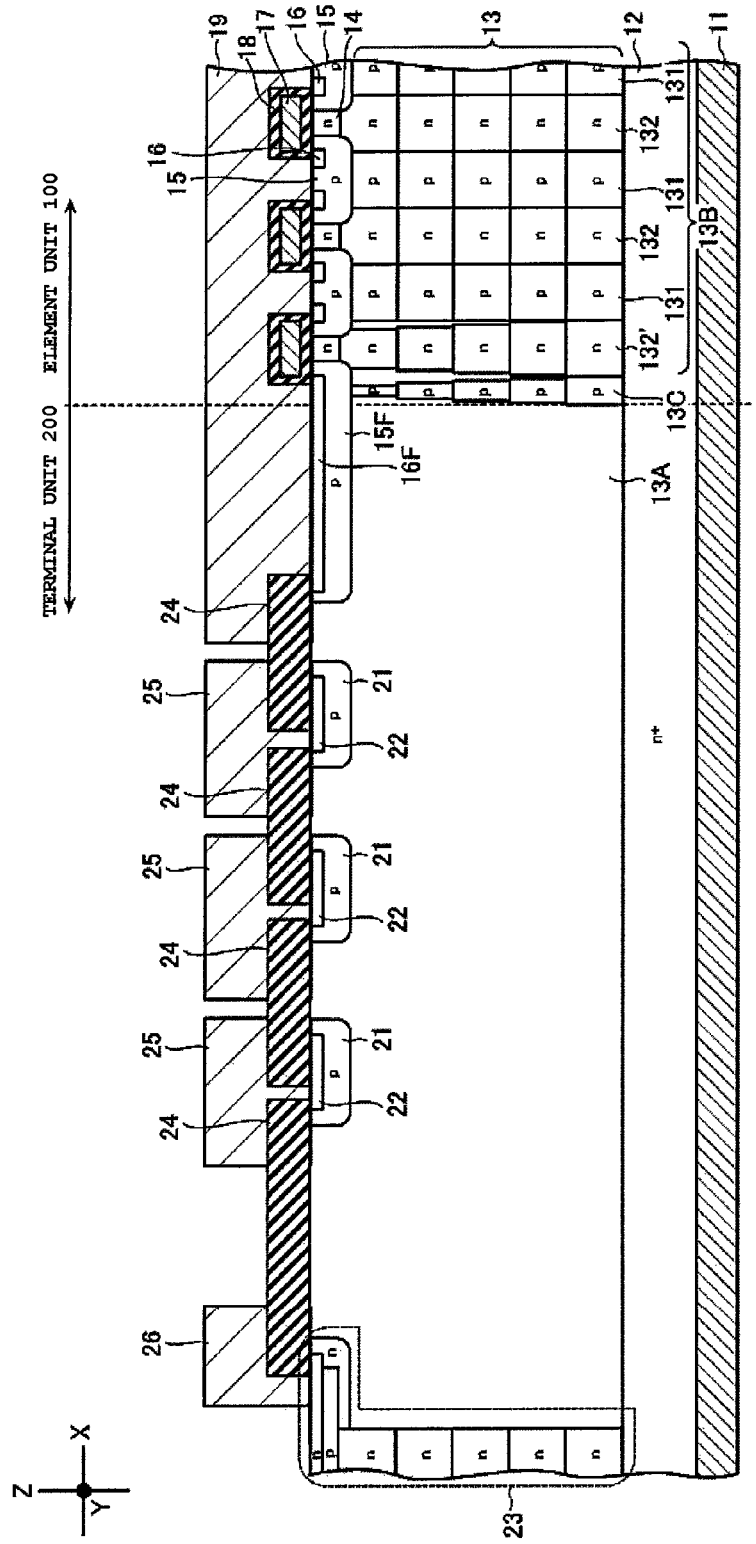
FIG. 2 is a Cross sectional diagram of a portion of the semiconductor device of the first embodiment.

Using FIG. 1 and FIG. 2 as a reference, the semiconductor device of the first embodiment will be described. FIG. 1 is a top view diagram of the semiconductor device of the first embodiment, and FIG. 2 is a cross-sectional view along the line labeled A-A' in FIG. 1. As shown in FIG. 1, the semiconductor device of the first embodiment has an element unit 100 that functions as a MOSFET, and a terminal unit 200 that both adjoins the element unit 100 and surrounds the element unit 100 on all sides in the X-Y plane.

First, the element unit 100 will be described. As shown in FIG. 2, the element unit 100 has a drain electrode 11, n+-type drain layer 12, and a semiconductor layer 13.

The n⁺-type drain layer 12 is formed on the drain electrode 11, and is connected electrically to the drain electrode 11. The semiconductor layer 13 is formed on top of the n⁺-type drain layer 12.

The semiconductor layer 13 has a super junction structure in the element unit 100. The semiconductor layer 13 has a high resistance semiconductor layer 13A, a periodic structure layer 13B and a terminal p-type pillar layer 13C.

A first part of the high resistance semiconductor layer 13A is formed within the element unit 100, while the rest of the high resistance semiconductor layer, which is continuous with the first part, is disposed within the terminal unit 200. The high resistance semiconductor layer 13A is composed of, for example, an intrinsic semiconductor into which ion impurities have not been injected, i.e., an undoped semiconductor.

The periodic structure layer 13B has p-type pillar layers 131 and n-type pillar layers 132, 132' extending in the Z direction (Perpendicular direction with respect to the surface of the n+-type drain layer 12). The p-type pillar layers 131 and the n-type pillar layers 132, 132' are arranged alternately in the X direction (Parallel direction to the surface of the Drain layer 12). That is, each p-type layer 131 is surrounded on each of two opposing sides by an n-type pillar layer 132 and each n-type pillar layer 132 is surrounded on each of two opposing sides by a p-type pillar layer 131. The structures of the p-type pillar layers 131 and the n-type pillar layers 132 will be described later.

The terminal p-type layer 13C borders the n-type pillar layer 132', which is located at one extreme, in the x-direction, of periodic structure layer 13B. The terminal p-type pillar layer 13C contains a single p-type semiconductor pillar which rises in the vertical direction (the Z direction). A more detailed structure of the terminal p-type pillar layer 13C will be described later.

The element unit 100 contains n-type drift layers 14, p-type base layers 15, n-type source layers 16, gate electrodes 17, gate insulation layers 18, and a source electrode 19. Each of the n-type drift layers 14 is formed on top of a corresponding one of the n-type pillar layers 132, 132'. Each of the p-type base layers 15 is formed on top of a corresponding one of the p-type pillar layers 131. The p-type base layers 15 collectively function as the channel of the MOSFET. In the cross-sectional diagram shown in FIG. 2, at each p-type base layer 15, two n-type source layers 16 are formed at an upper surface of the p-type base layer 15. However, a single p-type base layer 15F, which is located at the end of the element unit 100, is formed such that it is longer in the X direction as compared to the other p-type base layers 15. A portion of this p-type base layer 15F extends into the terminal unit 200. Also, a single n-type source layer—which is uniquely designated 16F part of which is located at the same end of the element unit 100, is created on an upper surface of p-type base layer 15F. The n-type source layer 16F is formed such that it is longer in the X direction as compared to the other n-type source layers 16. Also, a portion of the n-type source layer 16F is located within the terminal unit 200.

Gate electrodes 17 are formed above the n-type drift layers 14 and p-type base layers 15. A gate insulation layer 18 lies in between a bottom surface of each gate electrode 18 and the n-type drift layer 14 and two p-type base layers 15 located below the bottom surface. Each gate electrode 17 is positioned so as to overlie one of these two p-type base layers 15 near one of its sides, and to overlie the second of the two p-type base layers near a second side opposite to the first.

The gate electrodes 17 may be composed of polysilicon, and the gate insulation layers 18 may be composed of, silicon oxide, for example. Additionally, at a portion of the upper surface of each n-type source layer, a source electrode 19 is disposed directly above the surface and connected electrically to the n-type source layers 16.

Next, the terminal unit 200 is described. As shown in FIG. 2, terminal unit 200 has a drain electrode 11, n+-type drain layer 12 and semiconductor layer 13, which are integrally extending from corresponding elements in the element unit 100. However, in the terminal unit 200, the semiconductor layer 13 comprises the high resistance semiconductor layer 13A, which is intrinsic, and generally undoped, as compared to the periodic structure layer 13B, and the terminal p-type pillar layer 13C.

Overlying the semiconductor layer 13, the terminal unit 200 has p-type guard ring layers 21 and p+-type contact layers 22. To the side of high resistance semiconductor layer 13A at a far end of terminal unit 200 are n-type field stop layers 23. Also, p-type guard ring layers 21 are formed on top of the high resistance semiconductor layer 13A.

The p-type guard ring layers 21, each having a fixed pitch, form a closed loop structure in the x-y plane around the entire upper portion of element unit 100. The p-type guard ring layers 21 are provided to mitigate the electric field concentration in the terminal unit 200.

The p+-type contact layers 22 are formed over of the p-type guard ring layers 21. The field stop layer 23 is provided to block the growth of a depletion layer in the terminal unit 200.

The terminal unit 200 also includes insulation layers 24, field plate electrodes 25 and a field stop electrode 26. The insulation layers 24 are formed on top of the semiconductor layer 13 (high resistance semiconductor layer 13A). One insulation layer 24 is formed so that one end thereof is above and in contact with a p-type base layer 15F, while a second end thereof is above and in contact with a p-type guard ring layer 21. Also, three of the insulation layers 24 each have one end positioned over one guard ring layer 21, and another end positioned over a neighboring guard ring layer 21. However, one additional insulation layer 24 has one of its ends located over a p-type guard ring layer 21 and its opposite end positioned over a field stop layer 23.

Each of the field plate electrodes 25 have a lower surface in contact with one of the p+-type contact layers 22 disposed thereunder. The field stop electrode 26 is formed over the field stop layer 23 and a portion of an insulation layer 24.

Figure 3:
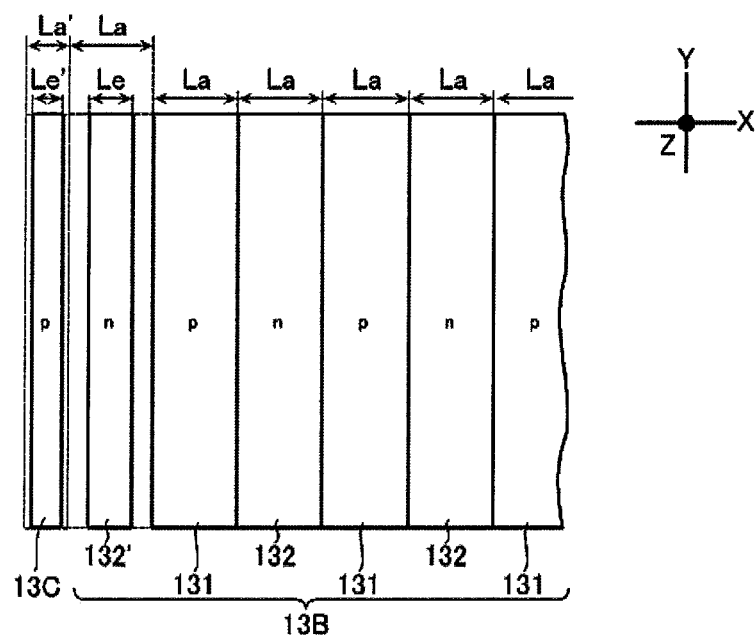
FIG. 3 is a top view diagram of a periodic structure layer and a terminal p-type pillar layer of the first embodiment.

Using FIG. 3 as a reference, the structures of the periodic structure layer 13B (p-type pillar layers 131, and n-type pillar layers 132), and the terminal p-type pillar layer 13C will now be described in detail. FIG. 3 is the top view diagram of the periodic structure layer 13B, and the terminal p-type pillar layer 13C.

As shown in FIG. 3, the p-type pillar layers 131 and the n-type pillar layers 132 are arranged to adjoin alternately in the X direction. The length in the Y direction (direction orthogonal to the X, Z directions) of each p-type pillar layer 131 and n-type pillar layer 132 is greater than its width in the X-direction. Aside from the n-type pillar layer 132' located at the end of the periodic structure layer 13B, each of the n-type pillar layers 132 and the p-type pillar layers 131 have a constant width La in the X direction. This width is constant in each of these pillars throughout their structure, both from one end to another in the Y-direction, and from the bottom to the top (constant width in the z-direction).

However, the width at the bottom of the n-type pillar layer 132' is La, and the width of the top end of the n-type pillar layer 132' is Le (Le<La). In this way, n-type pillar layer 132' has a tapered width such that the width gradually is reduced from the bottom to the top thereof.

Referring now to the terminal p-type pillar layer 13C, this pillar layer similarly has greater length in the Y-direction than its width in the x-direction. The width at the bottom of the terminal p-type pillar layer 13C is La', and the width of the top end of the terminal p-type pillar layer 13C is Le' (Le'<La'). The width of the terminal p-type pillar layer 13C gradually becomes narrower from the bottom end to the top end, thereby providing a widthwise tapering of its structure. Also, the width La' at the bottom of terminal p-type pillar layer 13C is equal to half the width La of the n-type pillar layers 132 and the p-type pillar layers 131 (La'=La/2).

Figure 4:
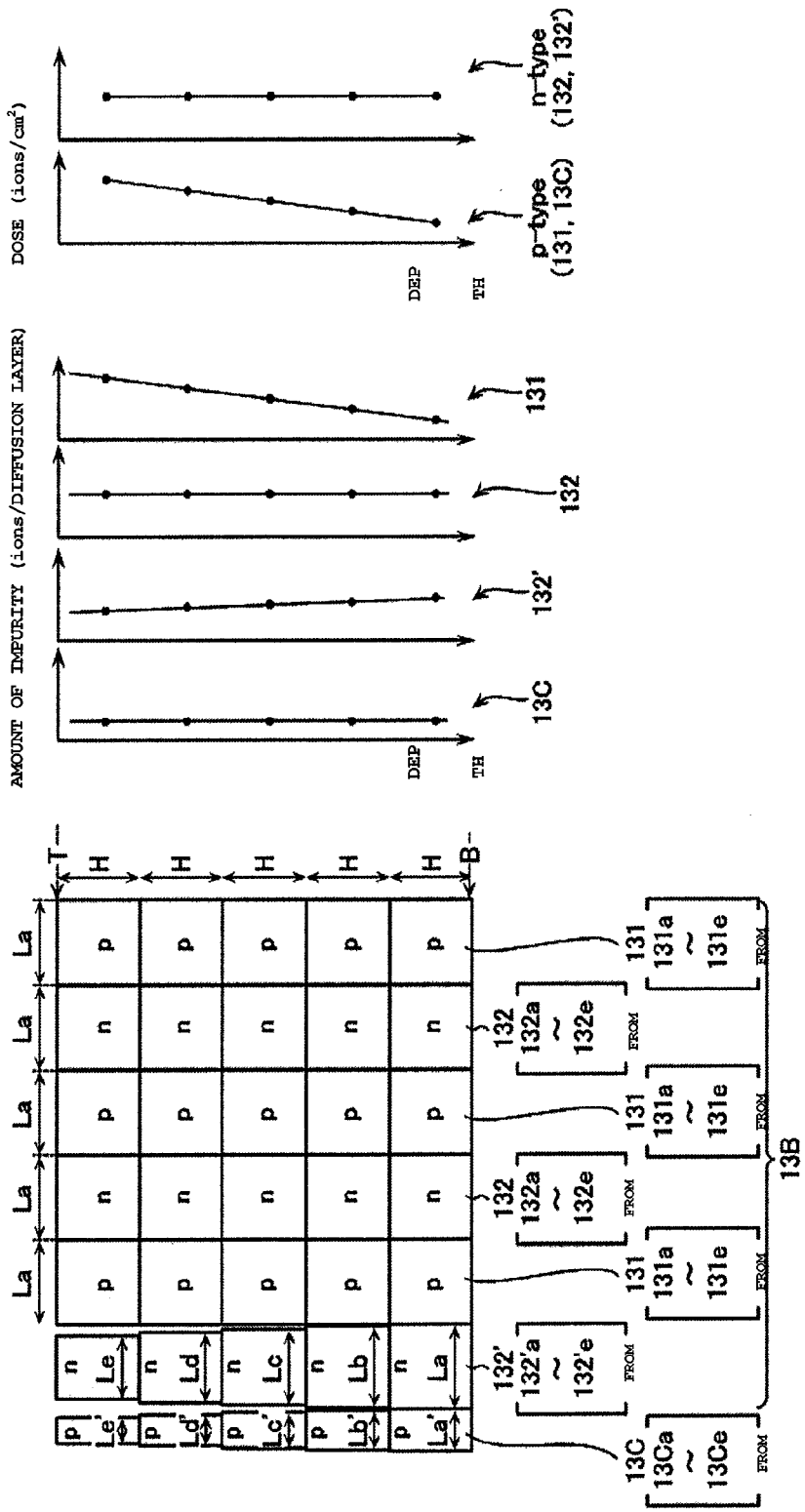
FIG. 4 shows an enlarged cross-sectional view of the periodic structure layer, and the terminal p-type pillar layer of the first embodiment, and depicts their impurity amount (ions), and dosage regimes (ions/cm$^2$) of the various pillars of the pillar layer

Using FIG. 4 as a reference, the periodic structure layer 13B (p-type pillar layers 131 and n-type pillar layers 132), and the terminal p-type pillar layer 13C will now be described more specifically. FIG. 4 shows a focused cross-sectional view centered on the periodic structure layer 13B, and the terminal p-type pillar layer 13C.

Each of the multiple p-type pillar layers 131 is comprised of multiple p-type diffusion layers 131a-e stacked one above the other, with the z-direction (direction perpendicular to the upper surface of the drain layer 12) being the direction of stacking. Each diffusion layer 131a-e is of height H, where height is assumed to be measured in the Z direction.

Each of the n-type pillar layers 132, 132' is composed of multiple n-type diffusion layers 132a-e, 132'a-e, respectively, which are each of height H in the z-direction, and which are stacked one on top of the other in the z-direction.

The terminal p-type pillar layer 13C is composed of multiple p-type diffusion layers 13Ca-e, which are each of height H in the Z-direction, and which are stacked one on top of the other in the z-direction. In FIG. 4 and the corresponding explanation, five diffusion layers 131a-e, 132a-e, 132'a-e, 13Ca-e are shown for each type of column. However, the number of diffusion layers need not be limited to five.

In each p-type pillar layer 131, the width in the X direction of each p-type diffusion layers 131a-e, is La. In some situations, there may be slight variation such that the width is approximately La in each p-type diffusion layer 131a-e.

Impurity ions are introduced into the p-type diffusion layers 131a-e of each p-type pillar layer 131. Within each p-type pillar layer, the gross amount of impurities (ions/diffusion layer) within each of the individual p-type diffusion layers 131a-e gradually increases from the bottom end B towards the top end T of the p-type pillar layer 131. That is, within each of p-type diffusion layers 131a-d, each of which is stacked on a lower p-type diffusion layer, there is a higher gross amount of impurities than in the diffusion layer immediately underneath it. In this embodiment, the gross amount of impurity (ions/diffusion layer) is defined as the amount of impurity ions contained in the relevant one of the diffusion layers 131a-e, 132a-e, 132'a-e, and 13Ca-e being described.

In the manufacturing process, the dose (ions/cm$^2$) for the p-type diffusion layers 131a-e, is gradually increased from the bottom B to the top T of the p-type diffusion layer 131. Dose (ion/cm$^2$) is defined as the amount of impurity ions irradiated per square centimeter of cross-sectional area of the relevant pillar layer in the x-y plane.

Furthermore, in the manufacturing process, the cross-sectional irradiation areas for the p-type diffusion layers 131a-e are equivalent for all of the layers, since the x-y dimensions are identical for all p-type diffusion layer 131a-e. Therefore, by irradiating the impurity ions using the above-mentioned dosage schedule, the gross amount of impurity (ions/diffusion layer) within a p-type diffusion layer 131a-e, gradually increases from the bottom end B to the top end T of the p-type pillar layer 131.

The width in the X direction is La for each of the n-type diffusion layers 132a-e within each n-type pillar layer 132. Moreover, for each n-type pillar layer 132, the gross amount of impurity (ions/diffusion layer) within the n-type diffusion layers 132a-e is the same for each of the layers. Alternatively, the amount of impurities (ions/diffusion layer) in the n-type diffusion layers 132a-e may change from the bottom end B towards the top end T of each n-type pillar layer 132, but the increase follows a different schedule (or gradient) than the change in the gross amount of impurity (ions/diffusion layer) seen from bottom diffusion layers to top diffusion layers for the p-type diffusion layers 131a-e of the p-type pillar layers 131.

In the manufacturing process associated with the first case, in which there is a constant gross amount of impurity in each n-type diffusion layer 132a-e, the dose (ions/cm$^3$) is equivalent for each of the n-type diffusion layers 132a-e. Moreover, in the manufacturing process, the irradiation area of the impurity ions is the same for each of the n-type diffusion layers 132a-e because each layer has identical width La, in addition to being of equivalent length in the y-direction. Thus, the irradiation cross-sectional areas are identical in each diffusion layer 132 a-e and by irradiating the impurity ions with the above mentioned dosage schedule, the gross amount of impurity (ions/diffusion layer) is the same within each of the n-type diffusion layers 132a-e.

Referring now to the n-type pillar layer 132', the width in the X direction of the n-type diffusion layers 132'a-e reflect the gradual narrowing taper from bottom B to top T that shapes the n-type pillar layer 132'. Here, the widths of n-type diffusion layers 132'a-e may be defined as La, Lb, Lc, Ld and Le, respectively. The widthwise tapering is such that La>Lb>Lc>Ld>Le. For n-type pillar layer 132', the dosage scheduling is such that the gross amounts of impurity (ions/diffusion layer) within each of its n-type diffusion layers 132'a-e are gradually reduced from the bottom B to the top T of the n-type pillar layer 132'.

In the manufacturing process, the dosage (ions/cm$^2$) is the same for each of the n-type diffusion layers 132'a-e. Also, in the manufacturing process, because of the widthwise tapering from top to bottom, the irradiation areas becomes smaller in moving from lower to higher n-type diffusion layers 132'a-e between the bottom B and the top T of the n-type pillar layer 132'. Therefore by irradiating the impurity ions with the above mentioned dosage schedule, there is a gradual decrease in the gross amount of impurity (ions/diffusion layer) within the n-type diffusion layers 132'a-e from the bottom B to the top T of the n-type pillar layer 132'.

The widths La'-Le' in the direction of the p-type diffusion layers 13Ca-e in one terminal p-type pillar layer 13C, are narrower than the widths of the p-type diffusion layers 131a-e, 132a-e, 132'a-e present at the same level, and become gradually narrower from the bottom end B towards the top end T of the terminal p-type pillar layer 13C (La'>Lb'>Lc'>Ld'>Le'). The amount of impurity ((ions/diffusion layer) within the p-type diffusion layers 13Ca-e in one terminal p-type pillar layer 13C, are mutually identical.

In the manufacturing process, the dose (ions/cm$^2$) for the p-type diffusion layers 13Ca-e, are gradually increased from the bottom end B towards the top end T of the terminal p-type pillar layer 13C. And, in the manufacturing process, the irradiation area of the impurity ions for the p-type diffusion layers 13Ca-e gradually decrease from the bottom end B towards the top end T of the terminal p-type pillar layer 13C, since their widths are La'-Le'. Therefore, if the impurity ions are irradiated with the above mentioned dose and irradiation area, the amount of impurity (ions/diffusion layer) within the p-type diffusion layers 13Ca-e, are mutually identical.

As described in the periodic structure layer 13B, as the p-type pillar layers 131 and the terminal p-type pillar layer 13C form pn junctions on both sides of the n-type pillar layers 132, their charge balances are maintained.

However, unlike with the periodic structure layer 13B, an n-type pillar layer 131' is created only at one end of the terminal p-type pillar layer 13C, while at the other end of the terminal p-type pillar layer 13C an n-type pillar layer is not created. For this reason, in this embodiment, the terminal p-type pillar layer 13C is configured so that tapered widths La'-Le' (in the X direction) are, at all locations, less than half of the width La (in the X direction) of the n-type pillar layer 131. Also, the widths La-Le in the X direction of the n-type pillar layer 132' are set based on the widths La'-Le' in the X direction of the terminal p-type pillar layer 13C. By arranging the pillars and shaping them to have widths in this manner, the charge balance of the element unit 100 is maintained.

Figure 5A:
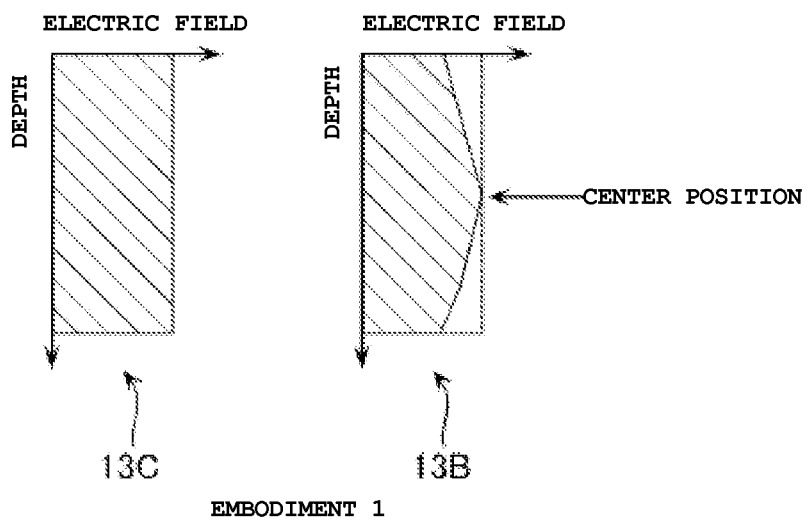
FIGS. 5A and 5B show the electric fields associated with pillars of the periodic structure layer, including the terminal p-type pillar layer of the first embodiment.
Figure 5B:
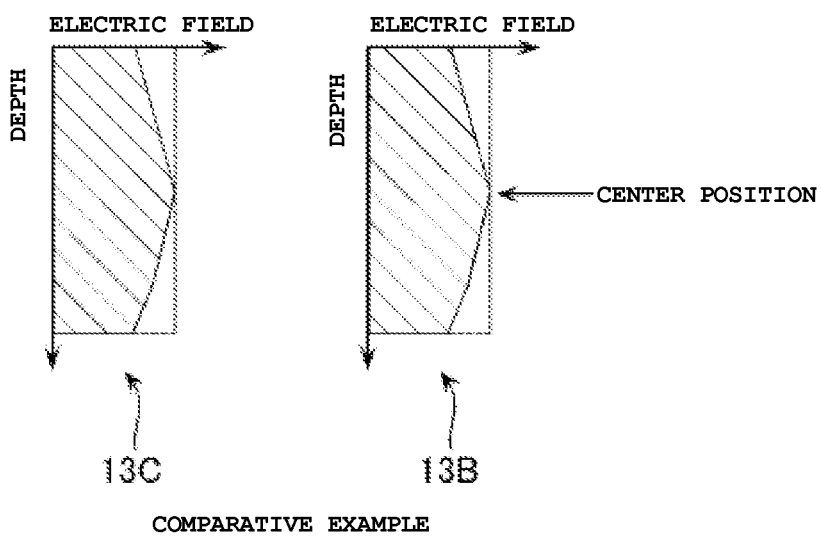

Using FIG. 5A as a reference, the effects of the first embodiment will be described. FIG. 5A shows the electric field distribution in the depth direction of the periodic structure layer 13B and the terminal p-type pillar layer 13C of the first embodiment. FIG. 5B show corresponding plots of electric field distributions for an exemplary different design presented for comparison purposes.

As can be understood with reference to FIG. 4, when the gross amounts of impurity (ions/diffusion layer) in the diffusion layers of the n-type pillars 131 and p-type pillars 132 are established using the methodology described with regards to FIG. 3 and FIG. 4, at approximately an intermediate depth (in the z-direction) in the periodic structure layer 13B, the gross amounts of the p-type and n-type impurities will be the same at each pillar 131, 132, 132'. For this reason, in the periodic structure layer 13B, the electric field distribution has a convex shape that peaks near the intermediate depth. By providing this electric field distribution, the first embodiment enables suppression of the decrease in the avalanche resistance while maintaining the breakdown voltage in the periodic structure layer 13B. Also, this embodiment enables further suppression to be achieved through altering the manufacturing process by utilizing the alternative techniques of the design process described above.

On the other hand, since a gate electrode is not formed on top of the terminal p-type pillar layer 13C, it is not necessary for the terminal p-type pillar layer 13C to have a structure providing avalanche resistance. Therefore, in the terminal p-type pillar layer 13C, the impurity amount (ions/diffusion layer) is set as described above and as depicted in FIG. 4. As a result of this, as shown in FIG. 5A, the electric field distribution in the terminal p-type pillar layer 13C is constant in the depth direction, causing the terminal p-type pillar layer 13C to have a high breakdown voltage.

FIG. 5B shows the electric field distribution associated with an example prior art design presented for comparative purposes. In the comparative example design, unlike this embodiment, the width (X direction) is the same in each p-type diffusion layer 13Ca-e and in the one terminal p-type pillar layer 13C. Also, in the manufacturing process of the comparative example, impurity ions are irradiated using the same dosage schedules (ions/diffusion layer) as described previously for the first embodiment of this disclosure. Because of this structuring and dosage scheduling, the terminal p-type pillar layer 13C has a gradual increase from the bottom B to the top T in the gross amount of impurity (ions/diffusion layer) within its p-type diffusion layers 13Ca-e. Due to this, in the comparative example, as shown in FIG. 5B, in the terminal p-type pillar layer 13C, the electric field distribution has a convex shape that peaks near an intermediate depth, and the breakdown voltage of the comparative example is lower than the breakdown voltage of the semiconductor device of the first embodiment of this disclosure.

(Manufacturing Process)

Next, using FIGS. 6A to 6C and FIGS. 7A and 7B as a reference, the manufacturing process of the semiconductor device of the first embodiment is described.

Figure 6A:
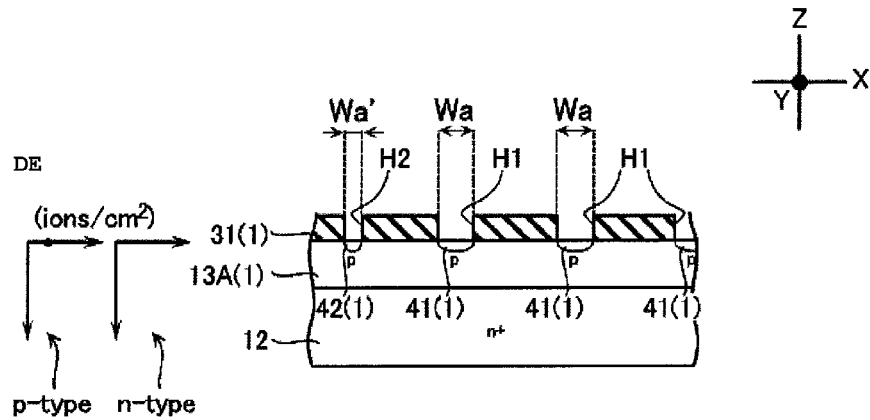
FIGS. 6A to 6C are cross-sectional diagrams depicting a manufacturing process of the first embodiment.

As shown in FIG. 6A, chemical vapor deposition (CVD) is used to deposit a high resistance semiconductor layer 13A(1) on top of an n+-type drain layer 12. Subsequently, a mask layer 31(1) is formed on top of the high resistance semiconductor layer 13A(1). In the mask 31(1), holes H1 are formed with a fixed pitch in the X direction. Also, hole H2 is created at the end of the element unit 100. The holes H1, H2 are formed in a striped pattern that extends in the Y Direction (not shown). The width Wa' in the X direction of the hole H2 is half of the width Wa in the X direction of the hole H1 (Wa'=($\frac{1}{2}$) Wa). Through the mask 31(1) described above, p-type impurity ions are injected into the high resistance semiconductor layer 13A(1). As a result of this, on the surface of the high resistance semiconductor layer 13A(1), p-type diffusion layers 41(1), 42(1) are formed that extend in a striped pattern (not shown) in the Y direction. The p-type diffusion layers 41(1), have a width Wa in the X direction, and are formed at the positions underlying the holes H1. The p-type diffusion layer 42(1), has a width Wa' in the X direction, and is formed at a position below the hole H2.

A next series of steps will be described with reference to FIG. 6B. Next, after removing the mask 31(1), mask 31(2) is formed on top of the high resistance semiconductor layer 13A(1). In the mask 31(2), holes H3 are created. The holes H3 are formed in a striped pattern that extends in the Y direction (not shown). The holes H3 are located between the p-type diffusion layers 41(1), and between the p-type diffusion layer 42(1) and its neighboring p-type diffusion layer 41(1). The holes H3 have a width Wa in the X direction.

Through the mask 31(2) described above, n-type impurity ions are injected into the high resistance semiconductor layer 13A(1). As a result of this, on the surface of the high resistance semiconductor layer 13A(1), n-type diffusion layers 43(1), 43(1)' are formed that extend in a striped pattern in the Y direction. The n-type diffusion layers 43(1), 43(1)' each have a width Wa in the X direction, and are formed at positions that are each below a corresponding one of the holes H3.

Figure 6B:
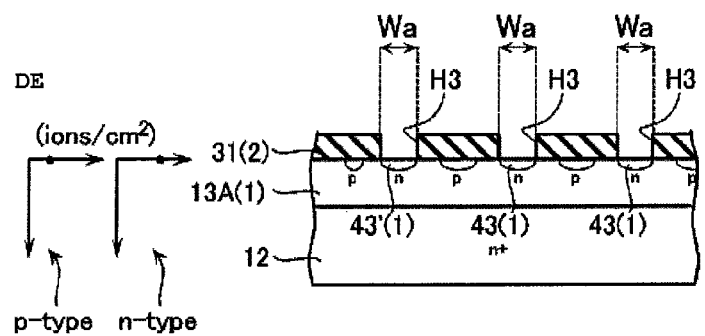
Figure 6C:
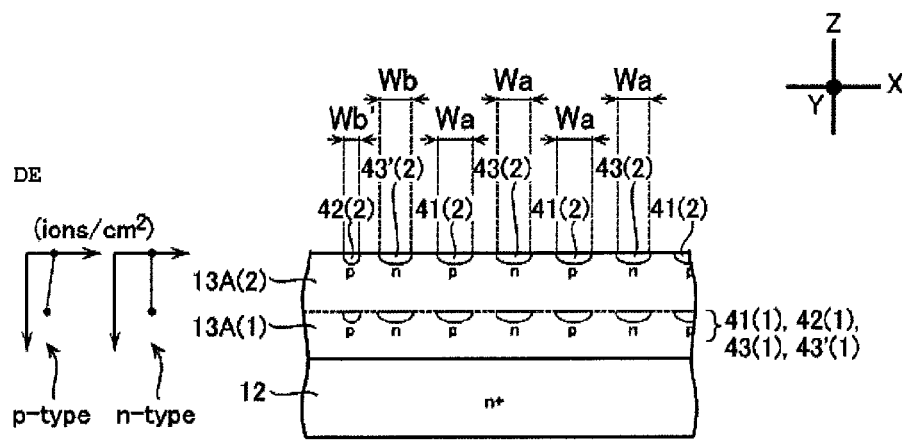

As shown in FIG. 6C, after removing the mask 31(2), a high resistance semiconductor layer 13A(2) is deposited on top of the high resistance, i.e., intrinsic, semiconductor layer 13A(1) using CVD techniques. Subsequently, each of the processes previously described in relation FIGS. 6A and 6B are executed again. In this second iteration of the processes, the repeated processes are directed this time upon the newly installed high resistance semiconductor layer 13A(2). As a result of this, p-type diffusion layers 41(2), 42(2), and n-type diffusion layers 43(2), 43'(2), are formed on top of the high resistance semiconductor layer 13A(2).

However, in the process shown in FIG. 6C, the dose (ions/$cm^2$) of the p-type impurity ions injected into to the high resistance semiconductor layer 13A(2), is larger than the dose of p-type impurity ions injected into the high resistance semiconductor layer 13A(1). In contrast, the dose (ions/$cm^2$) of the n-type impurity ions injected into the high resistance semiconductor layer 13A(2), is equivalent to the dose of n-type impurity ions injected into the high resistance semiconductor layer 13A(1). Also, the p-type diffusion layer 41(2) is formed having width Wa in the X direction, and the p-type diffusion layer 42(2) is formed having width Wb' in the X direction, wherein Wb'<Wa'. The n-type diffusion layer 43(2) is formed having width Wa in the X direction, and the n-type diffusion layer 43' (2) is formed having width Wb in the X direction, wherein Wb<Wa.

Figure 7A:
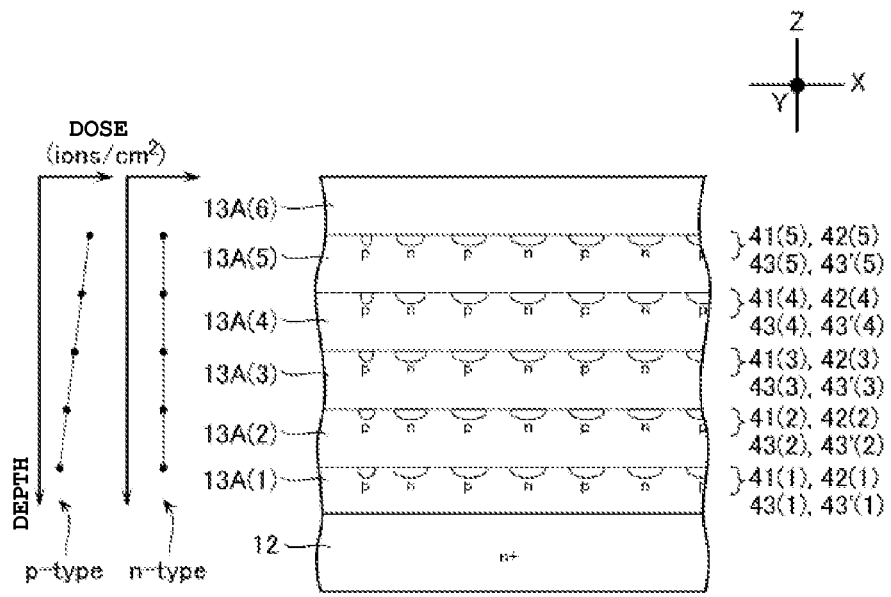
FIGS. 7A and 7B are cross-sectional diagrams depicting the manufacturing process of the first embodiment.

By repeatedly executing the process described above with regards to FIG. 6C, the laminated structure shown in FIG. 7A is formed. The structure of FIG. 7A has a high resistance semiconductor layer 13A(3) deposited on top of the high resistance semiconductor layer 13A(2). At the upper end of the high resistance semiconductor layer 13A(3), the p-type diffusion layers 41(3) and 42(3), and the n-type diffusion layers 43(3) and 43' (3) are formed.

Subsequently, a high resistance semiconductor layer 13A (4) is deposited on top of the high resistance semiconductor layer 13A(3). At the upper end of the high resistance semiconductor layer 13A(3), the p-type diffusion layers 41(4), 42(4), n-type diffusion layers 43(4), 43' (4) are formed. Next, a high resistance, i.e., intrinsic, semiconductor layer 13A(5) is deposited on top of the high resistance semiconductor layer 13A(4). Subsequently, the p-type diffusion layers 41(5), 42(5), and n-type diffusion layers 43(5), 43' (5) are formed on top of the high resistance semiconductor layer 13A(4). Next, a high resistance (intrinsic) semiconductor layer 13A(6) is deposited on top of the high resistance semiconductor layer 13A(5).

In the process shown in FIG. 7A, the dose schedule(ions/cm$^2$) of the p-type impurity ions is set so that each layer is provided a smaller dose than does a diffusion layer stacked directly thereover. Conversely, the dose schedule (ions/cm$^2$) of then-type impurity ions provides an equivalent does for each layer to which it is applied.

Also, in the process shown in FIG. 7A, the p-type diffusion layers 41(3)-(5) are formed so as to have a constant width Wa in the X direction. The p-type diffusion layers 42(3)-(5) are formed so that each layer having a layer stacked thereon is wider than the layer stacked thereover. The n-type diffusion layers 43(3)-(5) are formed so as to have a constant width Wa in the X direction, and the n-type diffusion layers 43' (3)-(5) are formed so that each layer having a layer stacked thereon is wider than the layer stacked thereover.

In this way, the irradiation area of the impurity ions is the same for each of the p-type diffusion layers 41(1)-(5). The irradiation areas of the impurity ions for the p-type diffusion layers 42(1)-(5) are smaller than the irradiation area of the impurity ions for the p-type diffusion layers 41(1)-(5). The irradiation areas of the impurity ions for the p-type diffusion layers 42(1)-(5) are smaller for each layer than for the layer positioned below it. The irradiation area of the impurity ions is the same for each of the n-type diffusion layers 43(1)-(5). The irradiation area of the impurity ions when forming the n-type diffusion layers 43' (1)-(5) is smaller for each successive upper layer than in the layer below it.

Figure 7B:
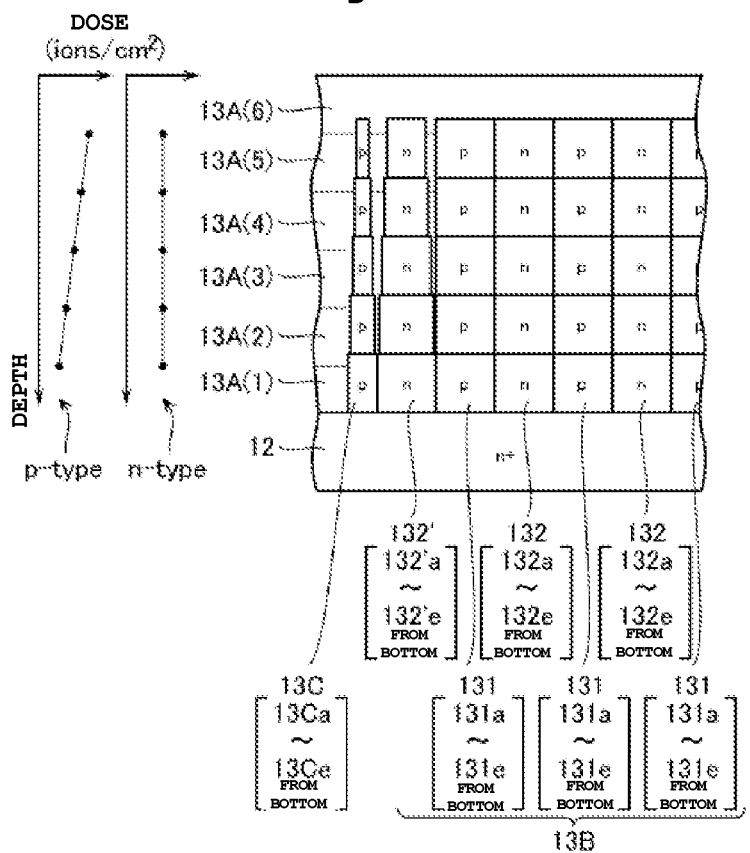

Next, heat treatment is carried out, and as shown in FIG. 7B, the p-type diffusion layers 41(1)-(5), 42(1)-(5), and n-type diffusion layers 43(1)-(5), 43' (1)-(5) are thermally diffused in the high resistance semiconductor layers 13(1)-(6). As a result of this, the p-type diffusion layers 41(1)-(5) form the p-type pillar layer 131 (p-type diffusion layers 131a-e). The p-type diffusion layers 42(1)-(5) form the terminal p-type pillar layer 13C (p-type diffusion layers 13Ca-e). The n-type diffusion layers 43(1)-(5) form the n-type pillar layer 132 (n-type diffusion layers 132a-e). The n-type diffusion layers 43' (1)-(5) form the n-type pillar layer 132' (n-type diffusion layers 132'a-e).

Figure 8:
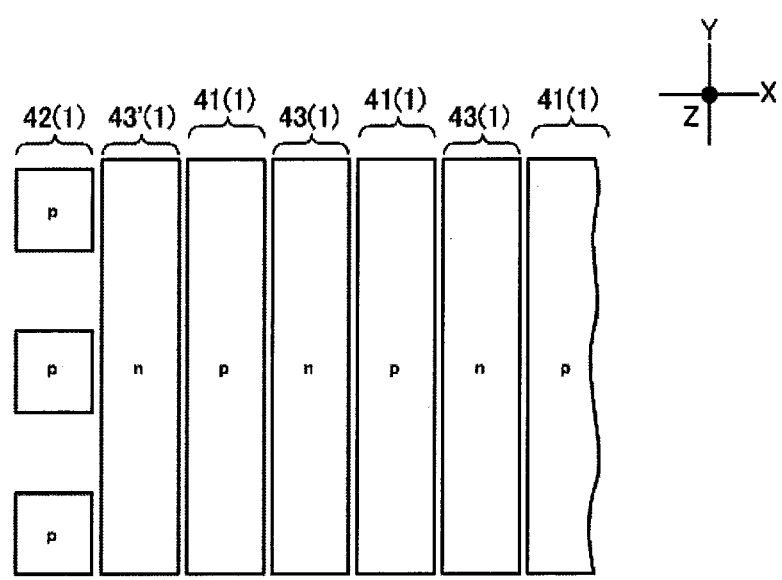
FIG. 8 is a top view diagram of another example pattern configuration of the p-type diffusion layers and the n-type diffusion layers associated with the manufacturing process of the first embodiment.

Next, using FIG. 8 as a reference, another example of a pattern of the p-type diffusion layers 41(1), 42(1), and the n-type diffusion layers 43(1), 43' (1) is described.

In the example shown in FIG. 8, as with the manufacturing process shown in FIGS. 6A to 6C, the p-type diffusion layer 41(1), and the n-type diffusion layers 43(1), 43' (1) are formed in a striped pattern extending in the Y direction, and have a fixed pitch in the X direction. On the other hand, in the example shown in FIG. 8, the p-type diffusion layers 42(1) are formed in a dotted pattern arranged in a column, and have a fixed pitch in the Y direction. The formation area of the p-type diffusion layer 42(1) is half of the formation area of the p-type diffusion layer 41(1).

Even though a pattern of the p-type diffusion layers 42(1) is a dotted pattern arranged in a column as described above, by their thermal diffusion, it is possible to form a terminal p-type pillar layer 13C having a width La' (La'=La/2) in the X direction. In addition, the other p-type diffusion layers 42(2)-(5) may also be formed in a pattern similar to that of the p-type diffusion layer 42(1) shown in FIG. 8.

Embodiment 2

Figure 9:
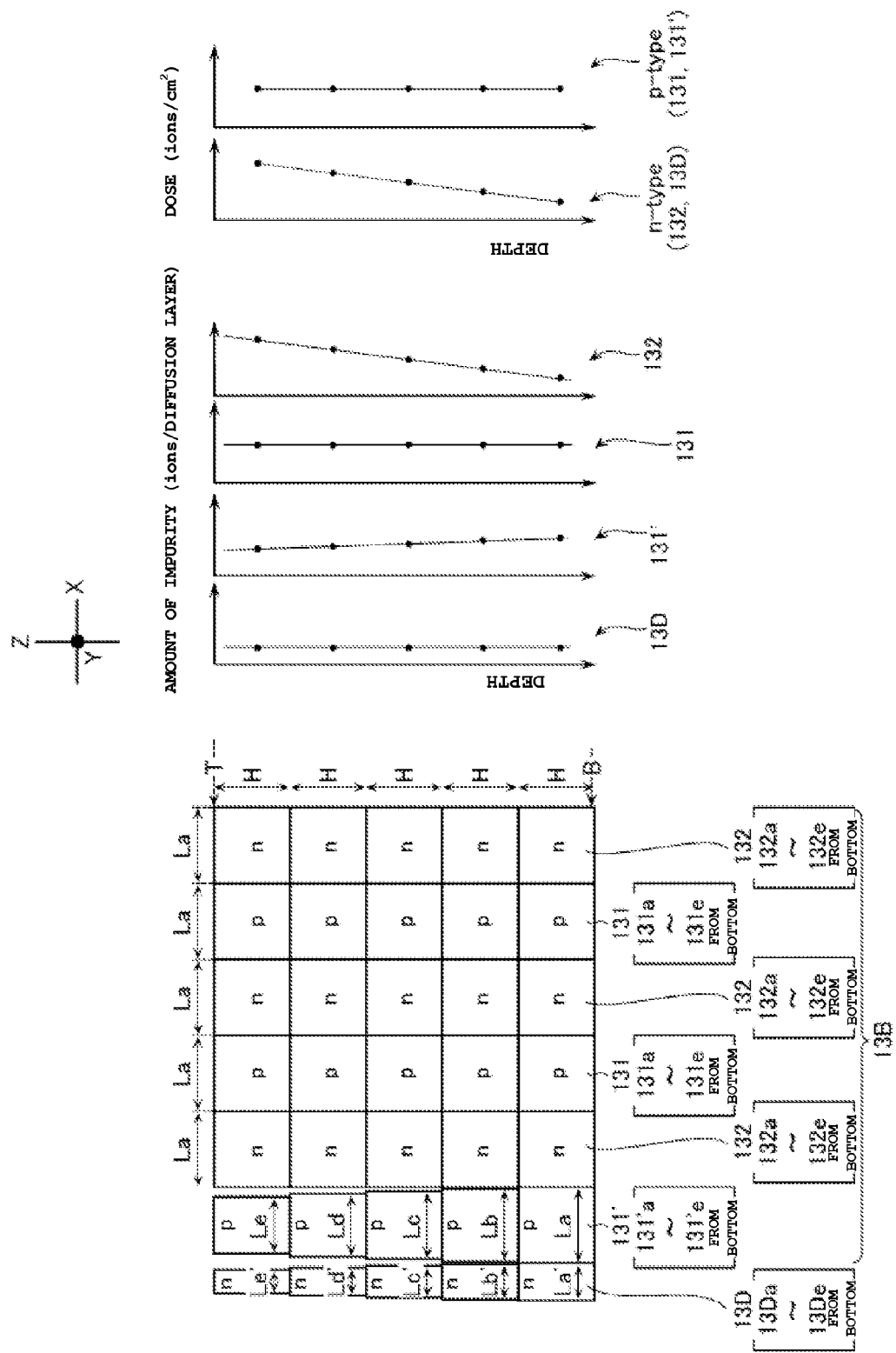
FIG. 9 is a figure that shows the enlarged crosssectional view of the periodic structure layer, and the terminal n-type pillar layer of a second embodiment, and the gross impurity quantities (ions) and dosage regimes associated with the various pillars depicted therein (ions/cm$^2$).

Next, using FIG. 9 as a reference, the semiconductor device of the second embodiment will be described. In the second embodiment, a p-type pillar layer 131' is located at an end in the X direction of the periodic structure layer 13B. In the location adjoining the p-type pillar layer 131', a terminal n-type pillar layer 13D is provided in place of the terminal p-type pillar layer 13C of the first embodiment.

In the second embodiment, the width of each n-type diffusion layer 132a-e within each of the n-type pillar layer 132 is La. Within each n-type pillar layer 132, the gross amount of impurity (ions/diffusion layer) within the n-type diffusion layers 132a-e increases from the bottom end B towards the top end T of the n-type pillar layers 132(1)-(3). On the other hand, in one p-type pillar layer 131', the widths La-Le of the p-type diffusion layers 131'a-e become narrower from the bottom B towards the top T of the p-type pillar layer 131. Also, within the one p-type pillar layer 131', the amount of impurity (ions/diffusion layer) within the p-type diffusion layers 131'a-e becomes gradually smaller from the bottom end B towards the top end T of the p-type pillar layer 131'.

In each of the other p-type pillar layers 131, the width of each p-type diffusion layer 131a-e is La. Within each p-type pillar layer 131, the gross amounts of impurity (ions/diffusion layer) within each p-type diffusion layers 131a-e, are identical.

Also, within the terminal n-type pillar layer 13D, the widths La'-Le' of the n-type diffusion layers 13Da-13De become gradually narrower from the bottom end B towards the top end T of the terminal n-type pillar layer 13D. The gross amount of impurity (ions/diffusion layer) within the n-type diffusion layers 13Da-13De of the n-type pillar layer 13D, is constant in the depth direction.

Also, in the manufacturing process of the second embodiment, when forming the terminal n-type pillar layer 13D and the n-type pillar layers 132, the n-type impurity ions are injected by successively increasing the dose (ions/cm$^2$) as higher-positioned layers are successively treated. However, when forming the p-type pillar layers 131, the p-type impurity ions are injected at a constant dose (ions/cm$^2$) from the bottom end B towards the top end T. Because of this dose scheduling, the second embodiment accomplishes the same effects as the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a drain electrode;
   a drain region of a first conductivity type electrically connected to the drain electrode;
   a periodic structure over the drain region, the periodic structure extending in a first direction perpendicular to an upper surface of the drain region and including semiconductor regions of the first conductivity type and semiconductor regions of a second conductivity type, the first conductivity type and the second conductivity type semiconductor regions being arranged alternately in a second direction parallel to an edge of the upper surface of the drain region;
   a third semiconductor region of the first conductivity type over the drain region, the third semiconductor extends in the first direction;
   a fourth semiconductor region of the second conductivity type located at an end of the periodic structure, a first side of the fourth semiconductor region being at the end of the periodic structure, a second side being in contact with the third semiconductor region;
   a drift region of the first conductivity type disposed on the first conductivity type semiconductor regions;
   a base region of the second conductivity type disposed on the second conductivity type semiconductor regions;
   a source region of the first conductivity type at disposed on upper surfaces of the base region;
   a gate electrode disposed above the base region;
   a gate insulation layer between the gate electrode and the base region; and
   a source electrode connected electrically to the source region, wherein
   each of the first semiconductor regions comprises multiple first diffusion layers stacked in the first direction, wherein all the first diffusion layers are of equal height, height being measured in the first direction,
   each of the second semiconductor regions comprises multiple second diffusion layers stacked in the first direction, wherein all of the second diffusion layers are of equal height,
   the third semiconductor region comprises multiple third diffusion layers stacked in the first direction, all of the third diffusion layers having equal height,
   within each of the second semiconductor regions, all of the multiple second diffusion layers are of equal width, width being measured in the second direction,
   within each of the second semiconductor regions, a gross amount of impurities within the individual second diffusion layers increases steadily in the first direction from the bottommost first diffusion layer to the uppermost first diffusion layer,
   within each first semiconductor region, all of the multiple first diffusion layers are of an equal width,
   all of the multiple first diffusion layers contain a same gross amount of impurities, and
   within the third semiconductor region, each third diffusion layer which has a higher third diffusion layer stacked thereon is wider than said higher third diffusion layer.

2. The semiconductor device of claim 1, wherein, within the third semiconductor region, every third diffusion layer having a higher third diffusion layer stacked thereon contains more impurities than said higher third diffusion layer.

3. The semiconductor device of claim 2 wherein,
   the fourth semiconductor region includes multiple fourth diffusion layers stacked in the first direction, each of said fourth diffusion layers is of a same height in the first direction,
   within the fourth semiconductor region each fourth diffusion layer which is disposed below a higher fourth diffusion layer stacked thereon is wider than said higher fourth diffusion layer.

4. The semiconductor device of claim 3, wherein within the fourth semiconductor region, a same gross amount of impurities is contained in each of the fourth diffusion layers.

5. The semiconductor device of claim 4, wherein within the fourth semiconductor region, the width in the second direction of the bottommost fourth diffusion layer is ½ of the width in the second direction of the first diffusion layers.

6. The semiconductor device of 5, wherein within the third semiconductor region, the width in the second direction of the bottommost third diffusion layer is less than the width in the second direction of the first diffusion layers.

7. The semiconductor device of 6, wherein the width in the second direction of the bottommost third diffusion layer is greater than the width in the second direction of the bottommost fourth diffusion layer in the fourth semiconductor region.

8. The semiconductor device of claim 7, wherein the periodic structure is formed alongside a high resistance semiconductor layer.

9. The semiconductor device of claim 8, wherein the high resistance semiconductor layer is an intrinsic semiconductor material into which ion impurities have not been injected.

10. The semiconductor device of claim 9, wherein the gate electrode is disposed above, but not directly over, the fourth semiconductor region.

11. The semiconductor device of claim 10, wherein the high resistance semiconductor layer is between an n-type field stop layer on one side and the periodic structure on an opposing side.

12. The semiconductor device of claim 1, wherein the first, second, third and fourth semiconductor regions are of identical length in a third direction parallel to the upper surface of the drain region and perpendicular to the first direction, and wherein, within each of the first, second, third and fourth semiconductor regions, the length is constant at all locations therein.

13. The semiconductor device of claim 1, the device further comprising an element unit configured to function as a metal-oxide semiconductor field-effect transistor, and a terminal unit surrounding the element unit on each outer side of the element unit.

14. The semiconductor device of claim 13, wherein further, the periodic structure is contained within the element unit.

15. The semiconductor device of claim 14, wherein each of the first, second, third and fourth semiconductor regions are of equal height in the first direction.

16. The semiconductor device of claim 1, wherein impurities are disposed in the first, second, third and fourth semiconductor regions in a manner which causes an electric field in the periodic structure to have a convex shape when a strength of the electric field is plotted versus depth within the periodic structure, wherein depth is measured in the second direction.

17. A semiconductor device, comprising:
a drain region of a first conductivity type;
a superjunction region disposed on the drain region and including:
  first semiconductor regions of the first conductivity type,
  second semiconductor regions of a second conductivity type, the first and second semiconductor regions extending in a first direction orthogonal to an upper surface of the drain region and alternating with each other in a second direction parallel to the upper surface of the drain region;
a gate electrode disposed above the superjunction region in the first direction, wherein,
an outermost, in the second direction, one of the first semiconductor regions has a tapered shape such that a width of said outermost one of the first semiconductor regions decreases along the first direction from the drain region towards the gate electrode, and
an outermost, in the second direction, one of the second semiconductor regions has a tapered shape such that a width of said outermost one of the first semiconductor regions decreases along the first direction from the drain region towards the gate electrode.

18. The semiconductor device of claim 17, wherein,
each of the first semiconductor regions includes a plurality of first diffusion layers stacked in the first direction, and
each of the second semiconductor regions includes a plurality of second diffusion layers stacked in the second direction.

19. The semiconductor device of claim 18, wherein
the tapered shape of the outermost one of the first semiconductor regions is formed by decreasing a width, along the second direction, of first diffusion layers in the plurality of first diffusion layers stacked in the first direction, and
the tapered shape of the outermost one of the second semiconductor regions is formed by decreasing a width, along the second direction, of second diffusion layers in the plurality of second diffusion layers stacked in the first direction.

20. The semiconductor device of claim 18, wherein in the outermost one of the first semiconductor regions, each first diffusion layer which has another first diffusion layer stacked above thereon in the first direction is wider than the first diffusion layer stacked above thereon.

21. The semiconductor device of claim 18, wherein
every first diffusion layer having another first diffusion layer stacked above thereon in the first direction has a greater impurity concentration than the first diffusion layer stacked above thereon.

\* \* \* \* \*